(12) United States Patent
Cho et al.

(10) Patent No.: US 12,362,139 B2
(45) Date of Patent: Jul. 15, 2025

(54) SEMICONDUCTOR INSPECTION APPARATUS AND SEMICONDUCTOR INSPECTION METHOD USING THE SAME

(71) Applicant: Samsung Electronics Co., Ltd., Suwon-si (KR)

(72) Inventors: Yujin Cho, Hwaseong-si (KR); Jonghyuk Kang, Seoul (KR); Inhye Park, Seoul (KR); Suyoung Lee, Seongnam-si (KR); Chungsam Jun, Suwon-si (KR); Hongche Noh, Seoul (KR); Janghee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 479 days.

(21) Appl. No.: 17/891,204

(22) Filed: Aug. 19, 2022

(65) Prior Publication Data

US 2023/0197402 A1 Jun. 22, 2023

(30) Foreign Application Priority Data

Dec. 22, 2021 (KR) .......................... 10-2021-0184699

(51) Int. Cl.
*H01J 37/28* (2006.01)
*H01J 37/147* (2006.01)
(Continued)

(52) U.S. Cl.
CPC .......... *H01J 37/28* (2013.01); *H01J 37/1471* (2013.01); *H01J 37/244* (2013.01); *H01J 37/265* (2013.01);
(Continued)

(58) Field of Classification Search
CPC ...... H01J 37/28; H01J 37/1471; H01J 37/244; H01J 37/265; H01J 2237/0048;
(Continued)

(56) References Cited

U.S. PATENT DOCUMENTS 4,420,686 A * 12/1983 Onoguchi ............... H01J 37/28
250/311
5,093,572 A * 3/1992 Hosono ................... H01J 37/28
250/306

(Continued)

FOREIGN PATENT DOCUMENTS

JP 2009026620 A 2/2009
JP 6310961 B2 4/2018
(Continued)

*Primary Examiner* — David A Vanore
(74) *Attorney, Agent, or Firm* — Muir Patent Law, PLLC (57) ABSTRACT

Disclosed are semiconductor inspection apparatuses and methods. The semiconductor inspection apparatus comprises a stage that supports a semiconductor device, a first column that irradiates a first electron beam toward the semiconductor device on the stage, a second column that irradiates a second electron beam toward the semiconductor device, and a detector that detects a secondary electron generated by the second electron beam. The first column is disposed to make a first angle with a top surface of the semiconductor device. The second column is disposed to make a second angle with the top surface of the semiconductor device. The first angle and the second angle are different from each other.

20 Claims, 9 Drawing Sheets (51) Int. Cl.
*H01J 37/244* (2006.01)
*H01J 37/26* (2006.01)

(52) U.S. Cl.
CPC .............. *H01J 2237/0048* (2013.01); *H01J 2237/24592* (2013.01); *H01J 2237/2817* (2013.01)

(58) Field of Classification Search
CPC ..... H01J 2237/24592; H01J 2237/2817; H01J 37/263; H01J 2237/24564; G01N 23/2251; G01R 31/01; G01R 31/2867; G01R 31/308
See application file for complete search history.

(56) References Cited

U.S. PATENT DOCUMENTS

| | | | | |
|---|---|---|---|---|
| 5,986,264 | A * | 11/1999 | Grunewald | H01J 37/28 250/492.21 |
| 6,812,462 | B1 * | 11/2004 | Toth | H01J 37/28 850/1 |
| 6,913,939 | B2 * | 7/2005 | Kang | G01R 31/307 324/754.22 |
| 7,598,491 | B2 * | 10/2009 | Fukunishi | H01J 37/28 250/311 |
| 9,816,946 | B2 * | 11/2017 | Stegmann | G01N 23/04 |
| 10,354,832 | B2 * | 7/2019 | Haynes | H01J 37/1474 |
| 10,539,589 | B2 * | 1/2020 | Ukraintsev | H01L 22/14 |
| 10,886,100 | B2 * | 1/2021 | Phaneuf | H01J 37/3005 |
| 11,127,560 | B2 * | 9/2021 | Persoon | H01J 37/20 |
| 2005/0012512 | A1 * | 1/2005 | Kolachina | H01J 37/3056 324/754.21 |
| 2006/0289752 | A1 * | 12/2006 | Fukunishi | H01J 37/28 250/310 |
| 2008/0018460 | A1 * | 1/2008 | Ishiguro | H01J 37/3005 250/492.21 |
| 2008/0061233 | A1 * | 3/2008 | Ogawa | G01R 31/307 250/307 |
| 2008/0296496 | A1 * | 12/2008 | Zhao | G01N 23/225 250/306 |
| 2013/0146765 | A1 * | 6/2013 | Kitayama | H01J 37/3056 250/311 |
| 2015/0364296 | A1 * | 12/2015 | Nomaguchi | H01J 37/10 250/367 |
| 2018/0025885 | A1 * | 1/2018 | Imai | H01J 37/12 250/311 |
| 2019/0227119 | A1 * | 7/2019 | Vickers | G01R 31/311 |
| 2019/0228948 | A1 * | 7/2019 | Mizuno | H01J 37/3056 |
| 2020/0088657 | A1 * | 3/2020 | Kuan | H01J 37/3005 |
| 2020/0312617 | A1 * | 10/2020 | Muraki | H01J 37/28 |
| 2022/0207698 | A1 * | 6/2022 | Zhong | G06V 10/19 |

FOREIGN PATENT DOCUMENTS

| | | |
|---|---|---|
| WO | 2021100144 A1 | 5/2021 |
| WO | 2021130992 A1 | 7/2021 |

* cited by examiner

SEMICONDUCTOR INSPECTION APPARATUS AND SEMICONDUCTOR INSPECTION METHOD USING THE SAME

CROSS-REFERENCE TO RELATED APPLICATION

This U.S. nonprovisional application claims priority under 35 U.S.C. § 119 to Korean Patent Application No. 10-2021-0184699, filed on Dec. 22, 2021, in the Korean Intellectual Property Office, the disclosure of which is hereby incorporated by reference in its entirety.

BACKGROUND

The present inventive concepts relate to a semiconductor inspection apparatus and a semiconductor inspection method using the same, and more particularly, to a semiconductor inspection apparatus capable of performing a non-contact inspection to detect the presence of defects in a semiconductor device and a semiconductor inspection method using the same.

A semiconductor device may be fabricated through various processes. For example, the semiconductor device may be fabricated through a photolithography process, an etching process, a deposition process, and a test process on a wafer. An electrical failure of the semiconductor device may be tested in the test process of the semiconductor device. In the test process, it is required to inject electrons into the semiconductor device. The semiconductor device into which electrons are implanted may be scanned to ascertain the presence of electrical failure in the semiconductor device. A scanning electron microscope (SEM) may be used in the test process.

SUMMARY

Some embodiments of the present inventive concepts provide a semiconductor inspection apparatus capable of preventing damage to a semiconductor device and a semiconductor inspection method using the same.

Some embodiments of the present inventive concepts provide a semiconductor inspection apparatus capable of achieving process automation and capable of being used in-line and a semiconductor inspection method using the same.

Some embodiments of the present inventive concepts provide a semiconductor inspection apparatus capable of being accurately controlled and easily inspected and a semiconductor inspection method using the same.

Some embodiments of the present inventive concepts provide a semiconductor inspection apparatus capable of detecting electrical failure and a semiconductor inspection method using the same.

The object of the present inventive concepts is not limited to those mentioned above, and other objects which have not been mentioned above will be clearly understood to those skilled in the art from the following description.

According to some embodiments of the present inventive concepts, a semiconductor inspection apparatus may comprise: a stage configured to support a semiconductor device; a first column configured to irradiate a first electron beam toward the semiconductor device on the stage; a second column configured to irradiate a second electron beam toward the semiconductor device; and a detector configured to detect a secondary electron generated by the second electron beam. The first column may be disposed to cause the first electron beam to form a first angle with a top surface of the semiconductor device. The second column may be disposed to cause the second electron beam to form a second angle with the top surface of the semiconductor device. The first angle and the second angle may be different from each other.

According to some embodiments of the present inventive concepts, a semiconductor inspection apparatus may comprise: a scanning electron microscope (SEM) assembly configured to irradiate an electron beam toward a semiconductor device; and a stage beneath the SEM assembly and configured to be movable in a horizontal direction relative to the SEM assembly. The SEM assembly may include: a first column configured to obliquely irradiate a first electron beam on a top surface of the semiconductor device; and a second column configured to vertically irradiate a second electron beam on the top surface of the semiconductor device.

According to some embodiments of the present inventive concepts, a semiconductor inspection method may comprise: placing a semiconductor device on a stage; irradiating a first electron beam on an electrode in a first inspection region of the semiconductor device; irradiating a second electron beam on the first inspection region of the semiconductor device; and detecting a secondary electron generated by the second electron beam and released from the first inspection region. The step of irradiating the first electron beam may include irradiating the first electron beam to make a first angle with a top surface of the semiconductor device. The step of irradiating the second electron beam may include irradiating the second electron beam to make a second angle with the top surface of the semiconductor device. The first angle and the second angle may be different from each other.

Details of other example embodiments are included in the description and drawings.

DETAIL DESCRIPTION

The following will now describe example embodiments of the present inventive concepts with reference to the accompanying drawings. Like reference numerals may indicate like components throughout the description.

Figure 1:
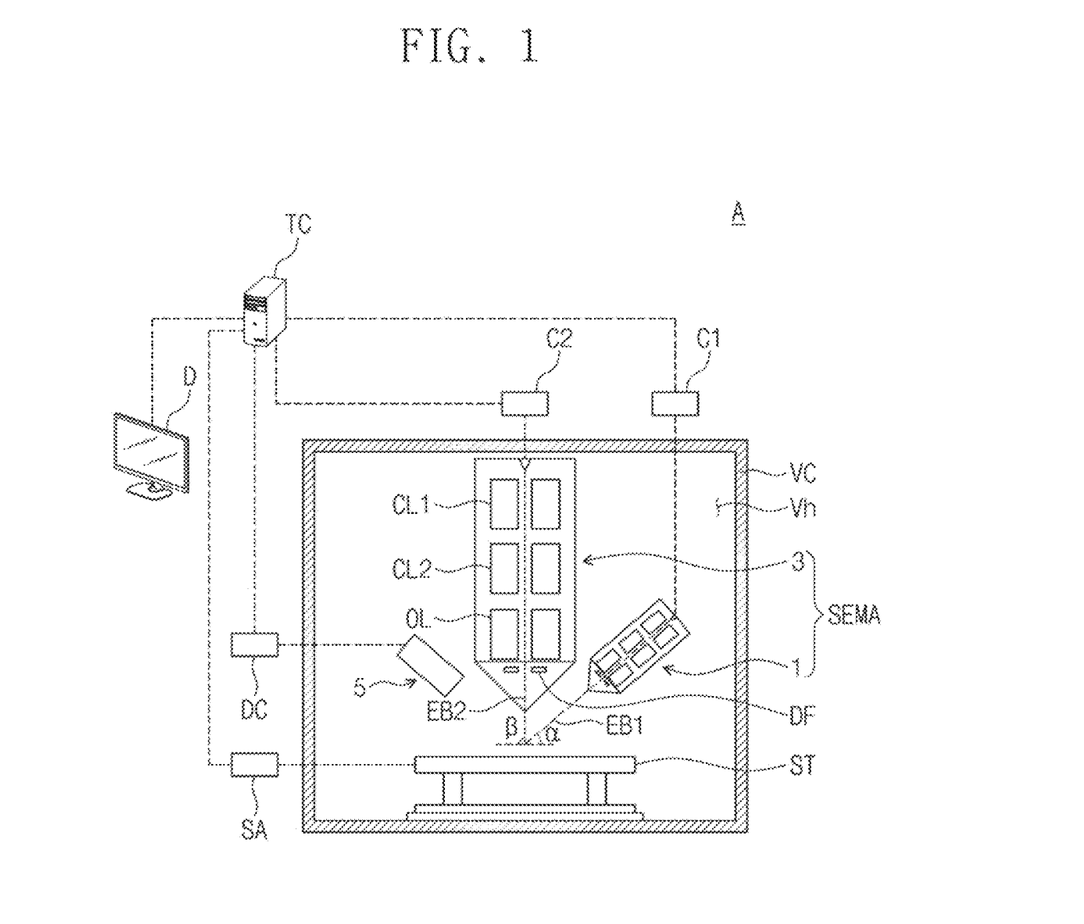
FIG. 1 illustrates a simplified diagram showing a semiconductor inspection apparatus, according to some example embodiments of the present inventive concepts.

FIG. 1 illustrates a simplified diagram showing a semiconductor inspection apparatus according to some example embodiments of the present inventive concepts.

Referring to FIG. 1, a semiconductor inspection apparatus A may be provided. The semiconductor inspection apparatus A may be a device to detect electrical defects of a semiconductor device. The semiconductor inspection apparatus A may include a vacuum chamber VC, a scanning electron microscope (SEM) assembly SEMA, a stage ST, a detector 5, a stage drive mechanism SA, a first column controller C1, a second column controller C2, a detector controller DC, an integrated controller TC, and a display D.

The vacuum chamber VC may provide an inspection space Vh. The inspection space Vh may maintain a vacuum state. There may be provided a vacuum pump (not shown) connected to the inspection space Vh. A semiconductor device may be disposed in the vacuum chamber VC. For example, the semiconductor device may be disposed on the stage ST in the vacuum chamber VC.

At least a portion of the SEM assembly SEMA may be positioned in the vacuum chamber VC. The SEM assembly SEMA may include a first column 1 and a second column 3.

The first column 1 may be a scanning electron microscope (SEM) column. The first column 1 may irradiate a first electron beam EB1 toward the semiconductor device on the stage ST. As the first column 1 irradiates the first electron beam EB1 toward the semiconductor device, the first column 1 may charge a conductor such as an electrode in the semiconductor device. For example, an electrode in the semiconductor device may be positively charged due to the irradiation of the first electron beam EB1 whose secondary electron yield is greater than 1. Alternatively, an electrode in the semiconductor device may be negatively charged due to the irradiation of the first electron beam EB1 whose secondary electron yield is less than 1. The first column 1 may include a condenser lens, an object lens, and a deflector. The first column 1 may make a first angle α with a top surface of the semiconductor device disposed on the stage ST. In FIG. 1, the top surface of the semiconductor device is represented by a dashed line. For example, the first column 1 may be disposed to allow the first electron beam EB1 irradiated therefrom to make the first angle α with the top surface of the semiconductor device. The first column 1 may have resolution less than that of the second column 3.

The second column 3 may be disposed spaced apart from the first column 1. The second column 3 may irradiate a second electron beam EB2 toward the semiconductor device on the stage ST. The second column 3 may be a scanning electron microscope (SEM) column. For example, an electrode of the semiconductor device charged with the first electron beam EB1 may be scanned with the second electron beam EB2 irradiated from the second column 3. The second column 3 may include a first condenser lens CL1, a second condenser lens CL2, an object lens OL, and a deflector DF. The deflector DF may control an irradiation angle of the second electron beam EB2. The second column 3 may make a second angle β with the top surface of the semiconductor device disposed on the stage ST. For example, the second column 3 may be disposed to allow the second electron beam EB2 irradiated therefrom to make the second angle β with the top surface of the semiconductor device. The second angle β may be different from the first angle α. For example, the second angle β may be about 90°, and the first angle α may be an acute angle. When the second angle β is a right angle, scanning may increase in accuracy. The first electron beam EB1 and the second electron beam EB2 may intersect each other on or beneath the top surface of the semiconductor device. A detailed description thereof will be further discussed below. The resolution of the second column 3 may be greater than that of the first column 1.

The stage ST may be positioned beneath the SEM assembly SEMA. The stage ST may support the semiconductor device. The semiconductor device may be disposed on a top surface of the stage ST. The stage ST may include a chuck for fixing the semiconductor device. For example, the stage ST may include either an electrostatic chuck (ESC) that uses an electrostatic force to fix the semiconductor device or a vacuum chuck that uses a vacuum pressure to fix the semiconductor device. The stage ST may move in a horizontal direction and/or a vertical direction relative to the SEM assembly SEMA. Therefore, the semiconductor device on the stage ST may also move in the horizontal direction and/or the vertical direction.

The detector 5 may detect one or more of secondary electrons SE and backscatter electrons generated from an electron beam. For example, the detector 5 may detect secondary electrons SE released out from the semiconductor device on which the second electron beam EB2 is irradiated. The integrated controller TC may receive information about the secondary electrons SE detected by the detector 5.

The stage drive mechanism SA may drive the stage ST to move. For example, the stage drive mechanism SA may horizontally move the stage ST on which the semiconductor device is disposed. For example, the stage drive mechanism SA may move the stage ST in a direction parallel to the top surface of the substrate W. A detailed description thereof will be further discussed below.

The first column controller C1 may control the first column 1. For example, the first column controller C1 may control an irradiation angle, a secondary electron yield, and an irradiation time of the first electron beam EB1 irradiated from the first column 1.

The second column controller C2 may control the second column 3. For example, the second column controller C2 may control an irradiation angle, a secondary electron yield, and an irradiation time of the second electron beam EB2 irradiated from the second column 3. For example, the second column controller C2 may control the deflector DF to control the irradiation angle of the second electron beam EB2.

The detector controller DC may control the detector 5. The detector controller DC may provide the integrated controller TC with information detected by the detector 5. The integrated controller TC may control the first column controller C1, the second column controller C2, the detector controller DC, and the stage drive mechanism SA. The integrated controller TC may form a contrast image by using the information about the secondary electrons SE that is delivered from the detector 5. The display D may be connected to the integrated controller TC. The display D may output the contrast image formed by the integrated controller TC. The presence of defects in the semiconductor device may be ascertained by the control image output on the display D. A detailed description thereof will be further discussed below.

Figure 2:
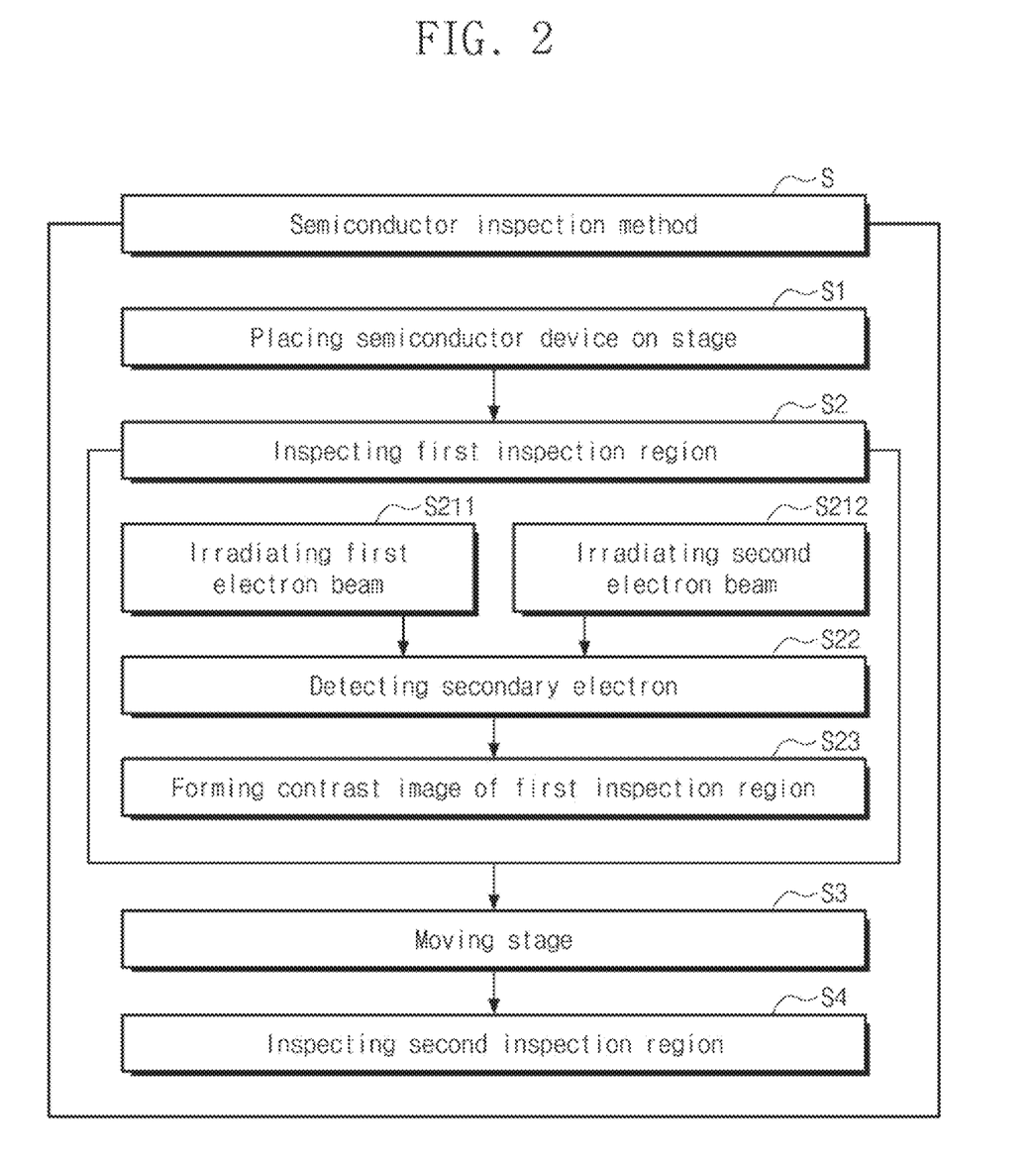
FIG. 2 illustrates a flow chart showing a semiconductor inspection method, according to some example embodiments of the present inventive concepts.

FIG. 2 illustrates a flow chart showing a semiconductor inspection method according to some example embodiments of the present inventive concepts.

Referring to FIG. 2, a semiconductor inspection method S may be provided. The semiconductor inspection method S may detect electrical defects of a semiconductor device by using the semiconductor inspection apparatus A discussed with reference to FIG. 1. The semiconductor inspection method S may include a step S1 of placing a semiconductor device on a stage, a step S2 of inspecting a first inspection region, a step S3 of moving the stage, and a step S4 of inspecting a second inspection region.

The first inspection step S2 may include a step S211 of irradiating a first electron beam, a step S212 of irradiating a second electron beam, a step S22 of detecting a secondary electron, and a step S23 of forming a contrast image of the first inspection region.

With reference to FIGS. 3 to 10, the following will describe in detail the semiconductor inspection method S of FIG. 2.

FIGS. 3 to 10 illustrate diagrams showing a semiconductor inspection method according to the flow chart of FIG. 2.

Figure 3:
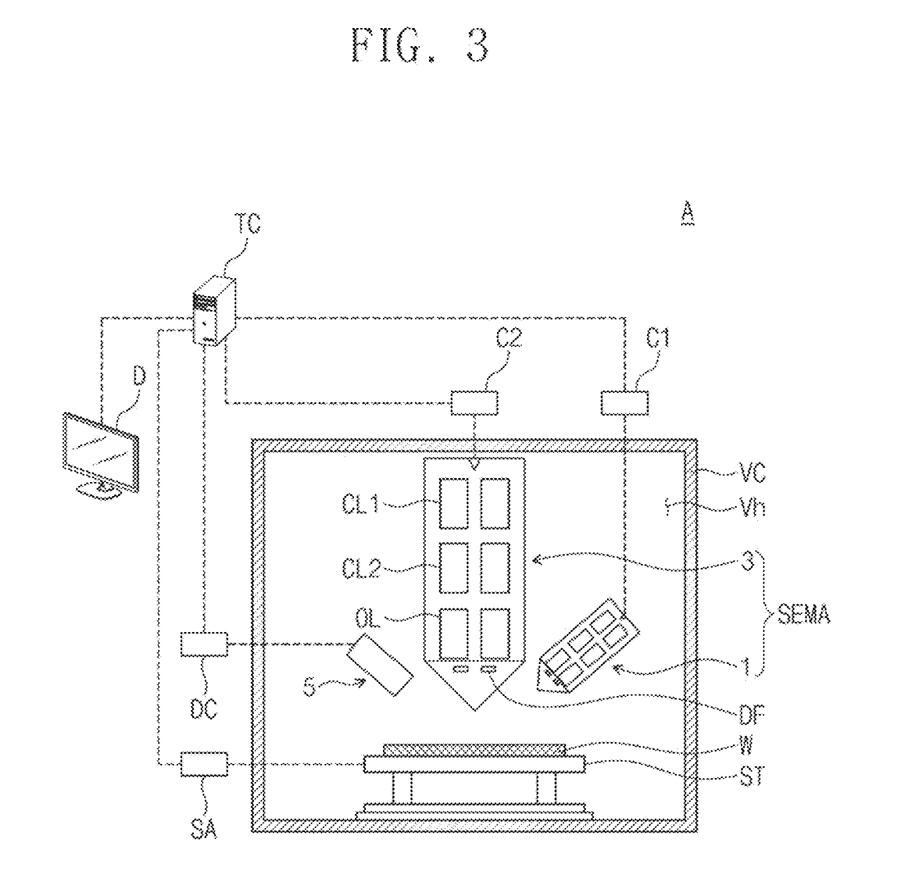
FIGS. 3 to 10 illustrate diagrams showing a semiconductor inspection method according to the flow chart of FIG. 2.

Referring to FIGS. 2 and 3, the placement step S1 may include placing a semiconductor device W on the stage ST. For example, the placement step S1 may include allowing the stage ST to rest thereon a semiconductor device W which is to be inspected. The semiconductor device W may be a wafer-shaped substrate on which wiring lines and transistors are formed. The present inventive concepts, however, are not limited thereto, and a chip-shaped semiconductor device W may be loaded on the stage ST. The semiconductor device W may be fixed onto the stage ST. After the placement of the semiconductor device W, the vacuum chamber VC may maintain a vacuum state therein.

Figure 4:
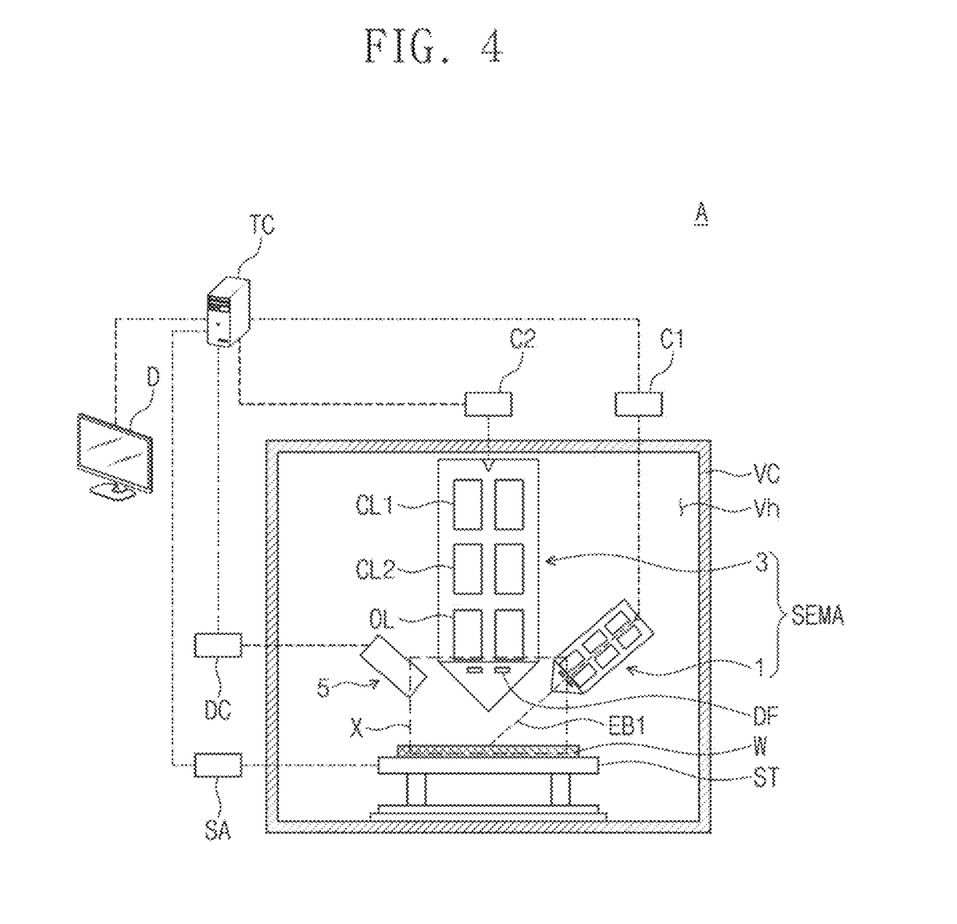
Figure 5:
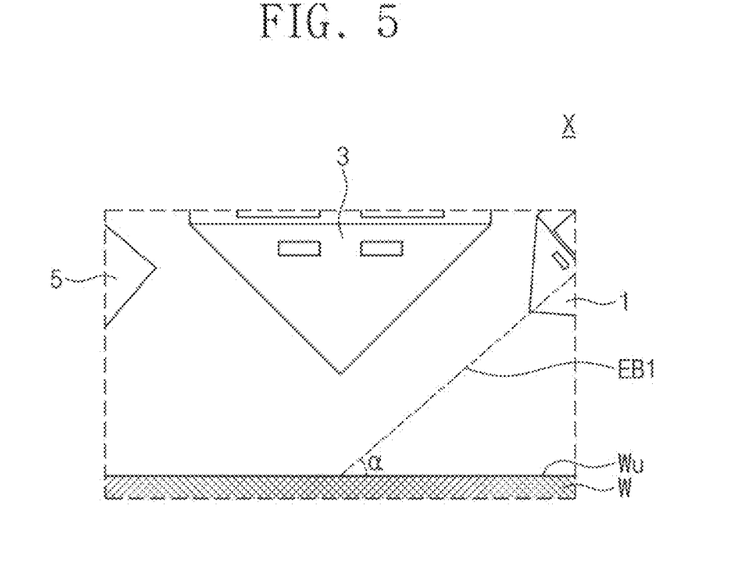

Referring to FIGS. 2, 4, and 5, the first irradiation step S211 may include allowing the first column 1 to irradiate the first electron beam EB1. The first column controller C1 may control the first column 1 to adjust one or more of a secondary electron yield and an irradiation time of the first electron beam EB1. Referring to FIG. 5, the first electron beam EB1 may be irradiated on the semiconductor device W such that the first electron beam EB1 may make the first angle α with a top surface Wu of the semiconductor device W. When the first angle α is an acute angle, the first electron beam EB1 may be obliquely irradiated on the top surface Wu of the semiconductor device W.

Figure 6:
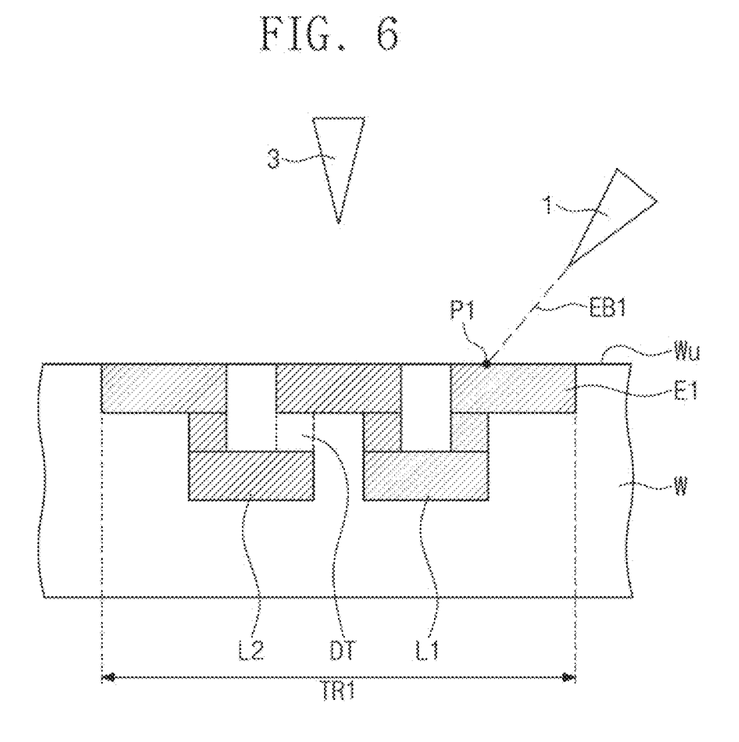

Referring to FIG. 6, the semiconductor device W may include an internal line. For example, a first internal line L1 and a second internal line L2 may be positioned on a first inspection region TR1 of the semiconductor device W. The first internal line L1 and the second internal line L2 may be disconnected to each other on a defective site DT. For example, the first internal line L1 and the second internal line L2 may not be electrically connected to each other due to defects during the formation process. The first electron beam EB1 may be irradiated on the first internal line L1. For example, the first electron beam EB1 may be irradiated on one side P1 on a first electrode E1. When the first electron beam EB1 is irradiated on the first electrode E1, the first internal line L1 may be charged. For example, when the first electron beam EB1 has a secondary electron yield greater than 1, the first internal line L1 may be positively charged. For more detail, when the first electron beam EB1, electrons of the first electron beam EB1 may encourage electrons to be released from the first internal line L1. For another example, when the first electron beam EB1 has a secondary electron yield less than 1, the first internal line L1 may be negatively charged. The following will describe an example in which the first internal line L1 is positively charged because the first electron beam EB1 has a secondary electron yield greater than 1. An entirety of the first internal line L1 may be positively charged due to the first electron beam EB1 irradiated on the one side P1 of the first internal line L1. In contrast, the defective site DT disconnects the second internal line L2 from the first internal line L1, and thus the second internal line L2 may not be charged.

Figure 7:
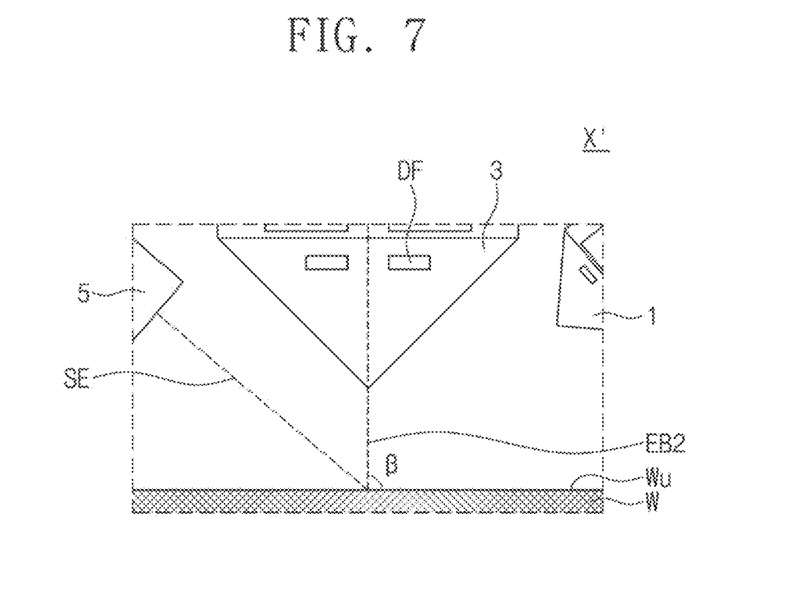

Referring to FIGS. 2 and 7, the second irradiation step S212 may include allowing the second column 3 to irradiate the second electron beam EB2. The first and second electron beams EB1 and EB2 may have their tracks intersect each other on the first inspection region TR1. For example, the tracks of the first and second electron beams EB1 and EB2 may intersect each other on the top surface Wu of the semiconductor device W. For another example, the tracks of the first and second electron beams EB1 and EB2 may intersect each other beneath the top surface Wu of the semiconductor device W. During the inspection of the first inspection region TR1, the stage ST may be fixed to a certain position. For example, a position of the stage ST at the first irradiation step 211 may be the same as that of the stage ST at the second irradiation step S212. When a first location is defined to indicate a position of the stage ST at the first irradiation step S211, a position of the stage ST at the second irradiation step S212 may also be the first location. In this sense, the semiconductor device W may be fixed to a certain position until completion of the inspection on the first inspection region TR1. The second column controller C2 may control the second column 3 to adjust one or more of a secondary electron yield and an irradiation time of the second electron beam EB2. For example, the second column controller C2 may control the deflector DF to control the irradiation angle of the second electron beam EB2. Therefore, in a state where the semiconductor W is fixed to a certain position, it may be possible to irradiate the second electron beam EB2 on an entirety of the first inspection region TR1. The second electron beam EB2 may be irradiated on the semiconductor device W such that the second electron beam EB2 may make the second angle β with the top surface Wu of the semiconductor device W.

Figure 8:
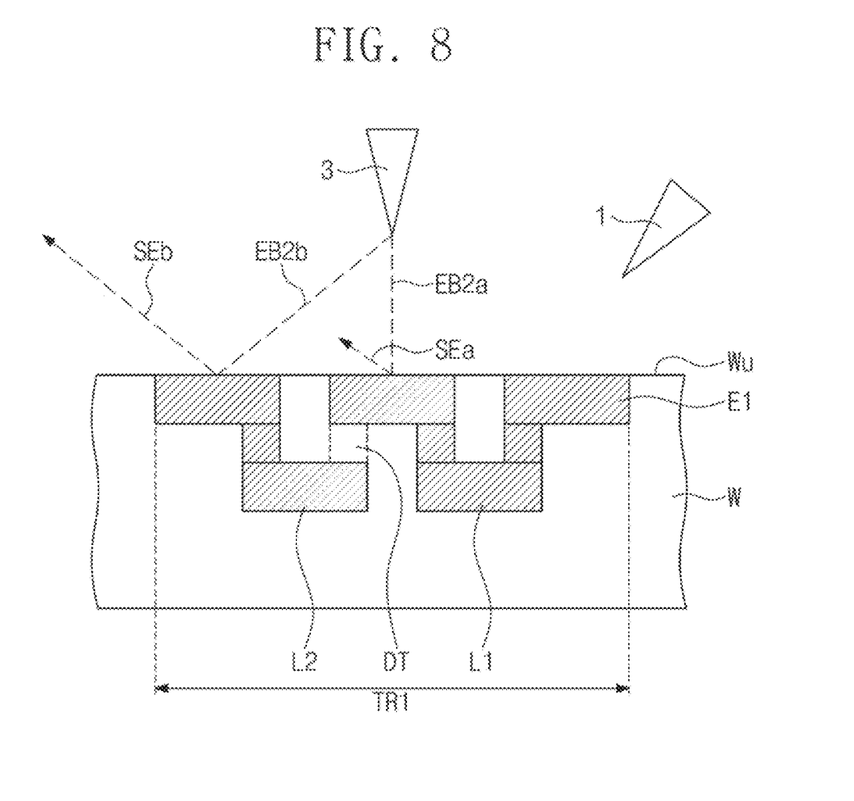

Referring to FIGS. 2 and 8, the detection step S22 may include allowing the detector (see, e.g., detector 5 of FIG. 3) to detect secondary electrons SE.

There may be a relatively large release of a secondary electron SEb from the second internal line L2 on which a second electron beam EB2b is irradiated. Alternatively, the secondary electron SEb may move a large distance from the second internal line L2 on which the second electron beam EB2b is irradiated. Thus, the detector (see, e.g., detector 5 of FIG. 3) may detect the secondary electron SEb released from the second internal line L2.

Because the first internal line L1 is positively charged, there may be a relatively small release of a secondary electron SEa from the first internal line L1 on which a second electron beam EB2a is irradiated. Alternatively, the secondary electron SEa may not move a large distance from the first internal line L1 on which the second electron beam EB2a is irradiated. Therefore, the detector (see, e.g., detector 5 of FIG. 3) may not detect the secondary electron SEa released from the first internal line L1. The detection step S22 may be performed substantially simultaneously with the second irradiation step S212.

It is shown and described that the first irradiation step S211 and the second irradiation step S212 may be sequentially performed, but the present inventive concepts are not limited thereto. For example, the first irradiation step S211 and the second irradiation step S212 may be performed at substantially the same time.

Figure 9:
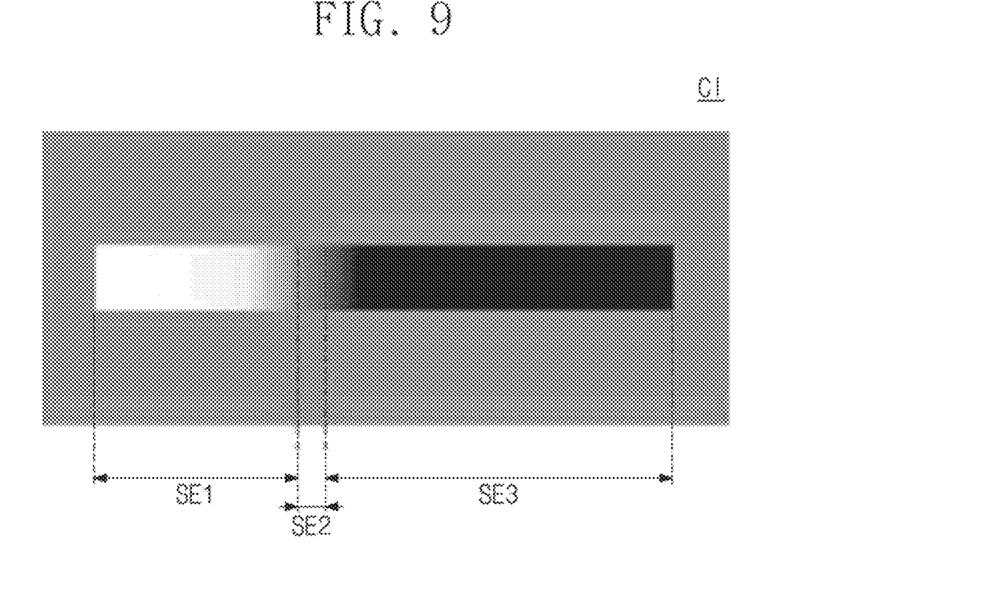

Referring to FIGS. 2 and 9, the contrast image formation step S23 may allow the integrated controller (see, e.g., integrated controller TC of FIG. 3) to form a contrast image CI by receiving information about secondary electrons SE detected from the detector (see, e.g., detector 5 of FIG. 3). The integrated controller TC may form the contrast image CI based on the information about the secondary electrons SE detected in the first inspection region (see, e.g., first inspection region TR1 of FIG. 6). The contrast image CI may be output to the display (see, e.g., display D of FIG. 3). No or scarce secondary electrons SE may be detected from the first internal line (see, e.g., first internal line L1 of FIG. 8), and thus there may be a dark section SE3 that corresponds to the first internal line L1. A relatively large amount of secondary electrons SE may be detected from the second internal line L2, and thus there may a bright section SE1 that corresponds to the second internal line L2. Through that discussed above, it may be possible to recognize the defective site (see, e.g., defective site DT of FIG. 8). For example, referring to FIG. 9, a boundary section SE2 between the bright section SE1 and the dark section SE3 may correspond to the defective site DT. Accordingly, it may be possible to determine the presence and position of the defective site DT in the first inspection region TR1.

Figure 10:
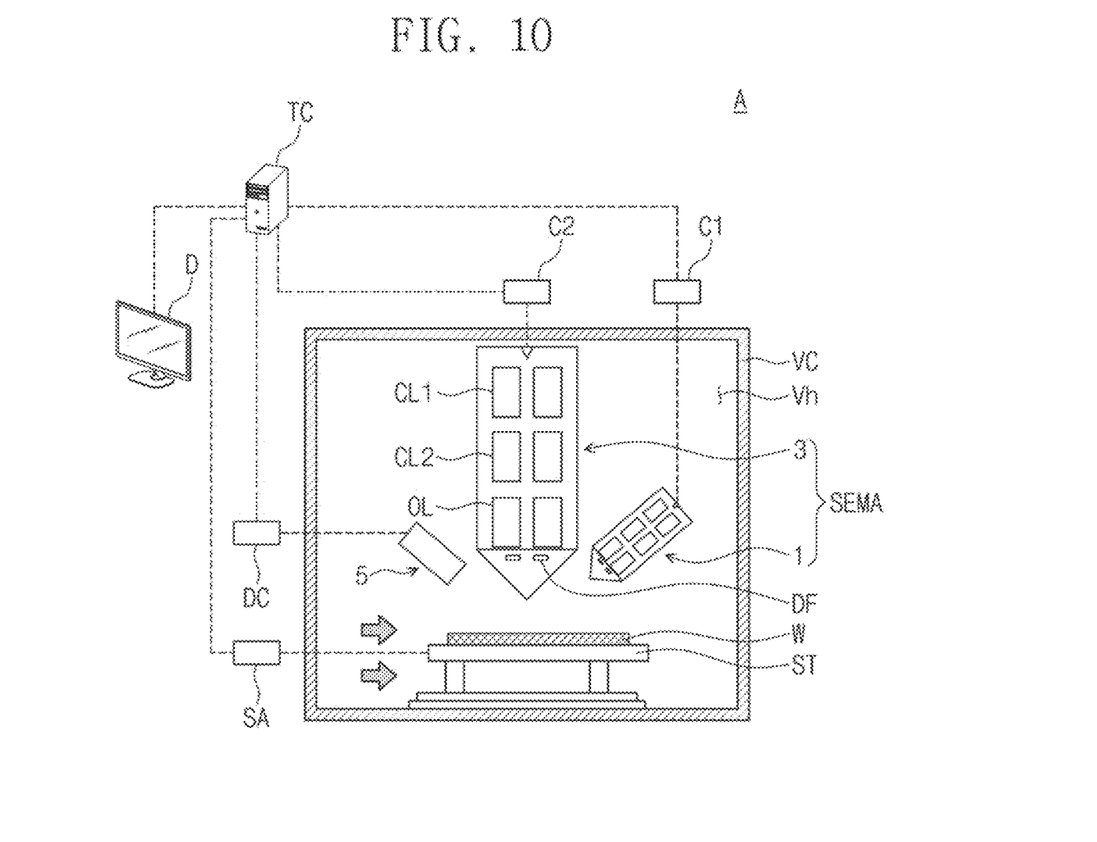

Referring to FIGS. 2 and 10, the movement step S3 may include allowing the stage drive mechanism SA to move in a horizontal direction and/or a vertical direction. Therefore, the semiconductor device W on the stage ST may also move in the horizontal direction and/or the vertical direction. After completion of the inspection on the first inspection region (see, e.g., first inspection region TR1 of FIG. 6), the semiconductor device W may move under the SEM assembly SEMA so as to inspect a second inspection region.

The second inspection step S4 may be performed by irradiation of electron beams from the first column 1 and the second column 3. For example, when the stage ST is used to move the semiconductor device W after completion of the inspection on the first inspection region (see, e.g., first inspection region TR1 of FIG. 6), an inspection may be performed on the second inspection region of the semiconductor device W.

According to a semiconductor inspection apparatus and a semiconductor inspection method using the same in accordance with example embodiments of the present inventive concepts, an electrode may be charged without directly contacting a semiconductor device. For example, electrical failure of the semiconductor device may be detected in a non-contact manner. Accordingly, the semiconductor device may be prevented from being damaged or contaminated due to contact during inspection.

According to a semiconductor inspection apparatus and a semiconductor inspection method using the same in accordance with example embodiments of the present inventive concepts, electrical defects of a semiconductor device may be detected without use of probes whose tips are in contact with the semiconductor device. Therefore, a facility may be configured with minimum mechanical configuration. Thus, there may be a reduction in requirements of maintenance for the facility. As there are no parts which are needed to be replaced regularly, it may be possible to automate the entirety of the semiconductor inspection method. Accordingly, it may be possible to perform in-line detection of electrical defects of the semiconductor device.

According to a semiconductor inspection apparatus and a semiconductor inspection method using the same in accordance with example embodiments of the present inventive concepts, a displacement angle of a first column 1 may be different from that of a second column 3. For example, the first column 1 and the second column 3 may be disposed non-parallel to each other. Thus, a first electron beam and a second electron beam may be irradiated onto the same point. In this case, a semiconductor device may be fixed to a certain position without movement in performing the semiconductor inspection method. It may thus be possible to detect electrical defects on one inspection region while the semiconductor device is fixed. There may be an increase in detection accuracy of electrical defects on the semiconductor device. As there is no need to move the semiconductor device during inspection, it may be possible to achieve easy controllability.

Figure 11:
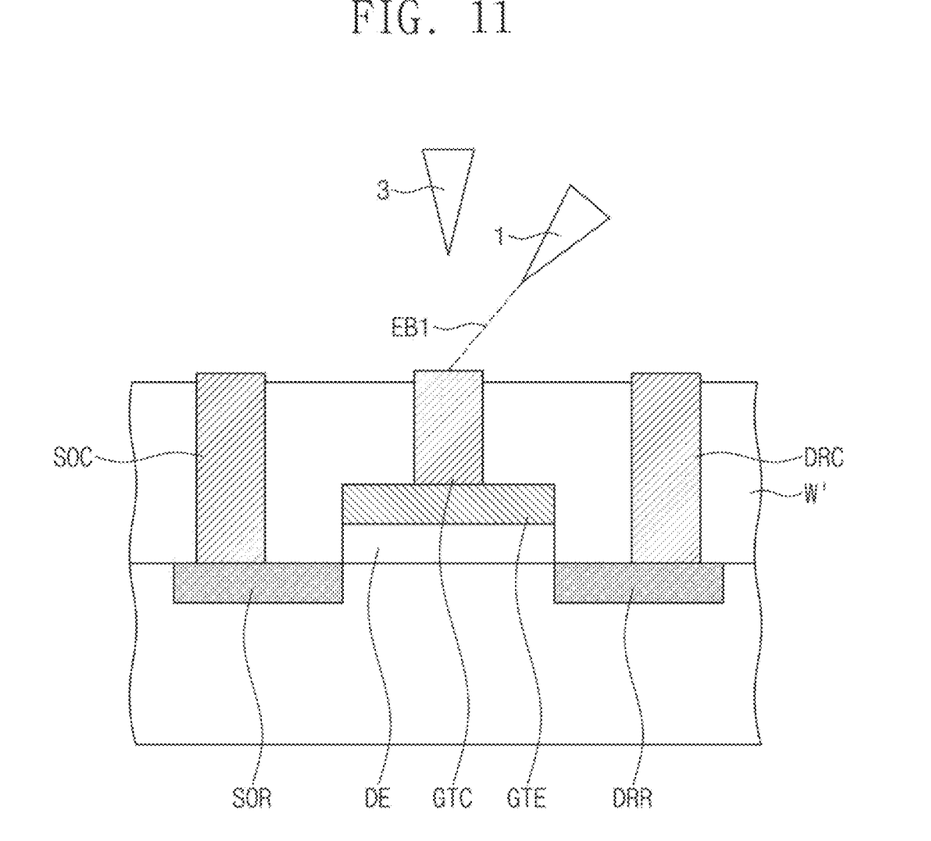
FIGS. 11 and 12 illustrate diagrams showing a semiconductor inspection method according to the flow chart of FIG. 2.
Figure 12:
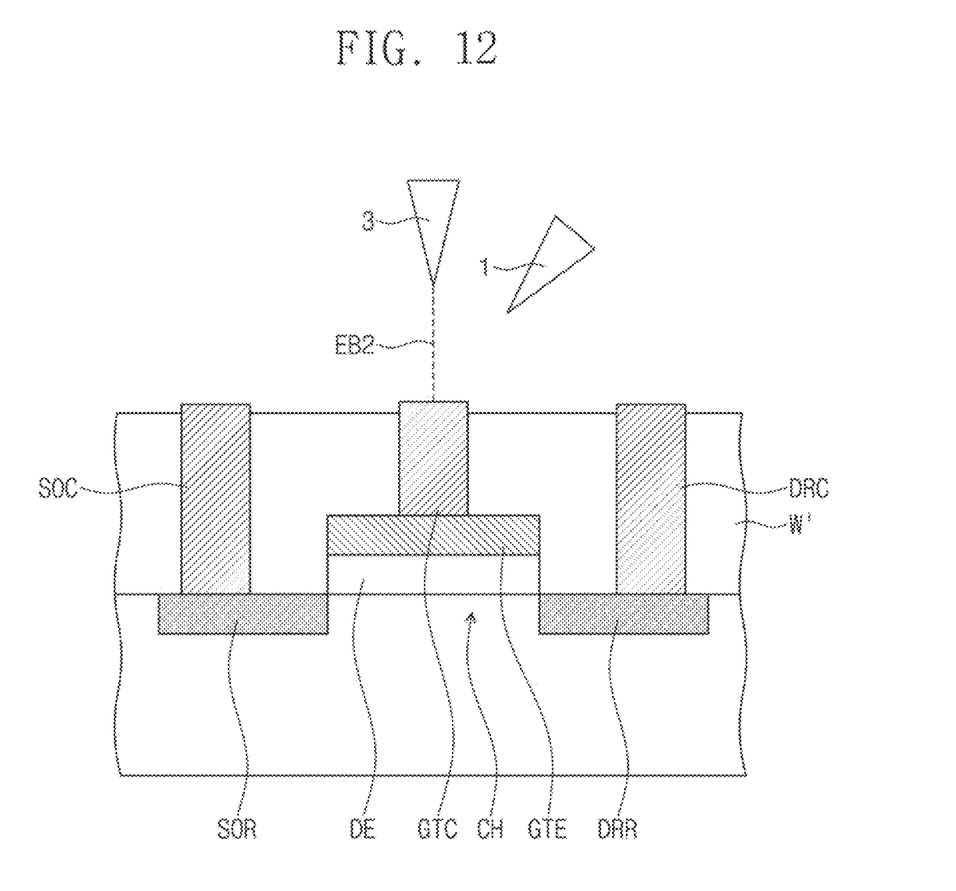

FIGS. 11 and 12 illustrate diagrams showing an example semiconductor inspection method according to the flow chart of FIG. 2.

In the embodiments that follow, omission will be made to avoid description of features substantially identical to or the same as those discussed with reference to FIGS. 1 to 10.

Referring to FIG. 11, it may be possible to detect electrical defects of MOSFET. For example, the first column 1 may irradiate the first electron beam EB1 toward a gate contact GTC. When the first electron beam EB1 irradiated from the first column 1 has a secondary electron yield greater than 1, a gate electrode GTE in contact with the gate contact GTC may be positively charged. Therefore, a channel (see, e.g., channel CH of FIG. 12) may be formed under a dielectric body DE. A source region SOR and a drain region DRR may be electrically connected to each other. The source region SOR may have a source contact SOC formed thereon, and the drain region DRR may have a drain contact DRC formed thereon.

Referring to FIG. 12, the second column 3 may irradiate the second electron beam EB2 toward the semiconductor device W'. The second electron beam EB2 may encourage secondary electrons SE to be released from the source contact SOC and the drain contact DRC. The detector (see, e.g., detector 5 of FIG. 1) may detect the released secondary electrons SE. The integrated controller (see, e.g., integrated controller TC of FIG. 1) may form a contrast image by using information about the secondary electrons SE delivered from the detector 5. Through that mentioned above, it may be possible to detect electrical defects of MOSFET.

According to a semiconductor inspection apparatus and a semiconductor inspection method using the same, it may be possible to prevent a semiconductor device from being damaged.

According to a semiconductor inspection apparatus and a semiconductor inspection method using the same, it may be possible to achieve process automation and in-line use.

According to a semiconductor inspection apparatus and a semiconductor inspection method using the same, it may be possible to accomplish accurate control and easy controllability.

According to a semiconductor inspection apparatus and a semiconductor inspection method using the same, it may be possible to detect internal electrical defects.

Effects of the present inventive concepts are not limited to the mentioned above, other effects which have not been mentioned above will be clearly understood to those skilled in the art from the following description.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are just illustrative but not limitative in all aspects.

What is claimed is:

1. A semiconductor inspection apparatus, comprising:
   a stage configured to support a semiconductor device;
   a first column configured to irradiate a first electron beam toward an electrode in a first inspection region of the semiconductor device on the stage;
   a second column configured to irradiate a second electron beam toward the first inspection region of the semiconductor device;

a detector configured to detect first secondary electrons and second secondary electrons generated by the second electron beam; and a display configured to display a contrast image based on the first and second secondary electrons, where the contrast image includes a first section based on the first secondary electrons and a second section based on the second secondary electrons, wherein the contrast image reflects a presence or an absence of an electrical defect in the semiconductor device, wherein the first column is disposed to cause the first electron beam to form a first angle with a top surface of the semiconductor device, wherein the second column is disposed to cause the second electron beam to form a second angle with the top surface of the semiconductor device, and wherein the first angle and the second angle are different from each other.

2. The semiconductor inspection apparatus of claim 1, wherein resolution of the second column is greater than resolution of the first column.

3. The semiconductor inspection apparatus of claim 1, wherein an axis of the first electron beam and an axis of the second electron beam intersect each other on the top surface of the semiconductor device or beneath the top surface of the semiconductor device.

4. The semiconductor inspection apparatus of claim 1, wherein the second angle is about 90°, and
wherein the first angle is an acute angle.

5. The semiconductor inspection apparatus of claim 1, wherein the second column includes a deflector that controls an irradiation direction of the second electron beam.

6. The semiconductor inspection apparatus of claim 1, wherein a brightness of the first section varies depending on the number of the first secondary electrons detected, and
wherein a brightness of the second section varies depending on the number of the second secondary electrons detected.

7. The semiconductor inspection apparatus of claim 6, wherein the number of the first secondary electrons detected is smaller than the number of the second secondary electrons detected, and
wherein the brightness of the second section is greater than the brightness of the first section.

8. A semiconductor inspection apparatus, comprising:
a scanning electron microscope (SEM) assembly configured to irradiate an electron beam toward a semiconductor device, the SEM assembly including a first column configured to obliquely irradiate a first electron beam toward an electrode in a first inspection region of the semiconductor device, and a second column configured to vertically irradiate a second electron beam toward the first inspection region of the semiconductor device; and
a stage beneath the SEM assembly and configured to be movable in a horizontal direction relative to the SEM assembly;
a detector configured to detect first secondary electrons and second secondary electrons generated by the second electron beam; and
a display configured to display a contrast image based on the first and second secondary electrons, the contrast image reflecting a presence of an absence of an electrical defect in the semiconductor device,
wherein the contrast image includes a first section based on the first secondary electrons and a second section based on the second secondary electrons.

9. The semiconductor inspection apparatus of claim 8, further comprising a stage drive mechanism configured to drive the stage to move in the horizontal direction or a vertical direction.

10. The semiconductor inspection apparatus of claim 8, wherein the first column includes a deflector configured to control an irradiation direction of the first electron beam.

11. The semiconductor inspection apparatus of claim 8,
wherein a brightness of the first section varies depending on the number of the first secondary electrons detected, and
wherein a brightness of the second section varies depending on the number of the second secondary electrons detected.

12. The semiconductor inspection apparatus of claim 11,
wherein the number of the first secondary electrons detected is smaller than the number of the second secondary electrons detected, and
wherein the brightness of the second section is greater than the brightness of the first section.

13. A semiconductor inspection method, comprising:
placing a semiconductor device on a stage;
irradiating a first electron beam on an electrode in a first inspection region of the semiconductor device;
irradiating a second electron beam on the first inspection region of the semiconductor device;
detecting first secondary electrons and second secondary electrons generated by the second electron beam and released from the first inspection region, and
forming a contrast image of the first inspection region based on the first and second secondary electrons,
wherein the contrast image includes first section based on the first secondary electrons and a second section based on the second secondary electrons,
wherein irradiating the first electron beam includes irradiating the first electron beam to make a first angle with a top surface of the semiconductor device,
wherein irradiating the second electron beam includes irradiating the second electron beam to make a second angle with the top surface of the semiconductor device, and
wherein the first angle and the second angle are different from each other.

14. The semiconductor inspection method of claim 13, wherein irradiating the first electron beam and irradiating the second electron beam are performed sequentially.

15. The semiconductor inspection method of claim 14,
wherein, in irradiating the first electron beam, the stage that supports the semiconductor device is fixed to a first location, and
wherein irradiating the second electron beam is performed in a state where the stage is fixed to the first location.

16. The semiconductor inspection method of claim 13, further comprising:
determining a presence or an absence of an electrical defect in the semiconductor device based on the contrast image.

17. The semiconductor inspection method of claim 13, further comprising:
after detecting the first and second secondary electrons generated from the first inspection region, moving the stage; and
after moving the stage, inspecting a second inspection region distinguished from the first inspection region.

18. The semiconductor inspection method of claim 13, wherein irradiating the first electron beam includes positively charging the electrode by allowing the first electron beam to have a secondary electron yield greater than 1.

19. The semiconductor inspection method of claim 13, wherein an axis of the first electron beam and an axis of the second electron beam intersect each other in the first inspection region.

20. The semiconductor inspection method of claim 13, wherein the second angle is about 90°, and wherein the first angle is an acute angle.

* * * * *